US006551903B1

United States Patent
Shi et al.

(10) Patent No.: US 6,551,903 B1
(45) Date of Patent: Apr. 22, 2003

(54) MELT THROUGH CONTACT FORMATION METHOD

(75) Inventors: Zhengrong Shi, Shanghai (CN); Paul Alan Basore, Caringbah (AU); Stuart Ross Wenham, Menai Heights (AU); Guangchun Zhang, West Ryde (AU); Shijun Cai, Kingsford (AU)

(73) Assignee: Pacific Solar Pty. Limited, New South Wales (AU)

( * ) Notice: Subject to any disclaimer, the term of this patent is extended or adjusted under 35 U.S.C. 154(b) by 0 days.

(21) Appl. No.: 09/807,373

(22) PCT Filed: Oct. 12, 1999

(86) PCT No.: PCT/AU99/00871

§ 371 (c)(1),
(2), (4) Date: May 31, 2001

(87) PCT Pub. No.: WO00/22681

PCT Pub. Date: Apr. 20, 2000

(30) Foreign Application Priority Data

Oct. 12, 1998 (AU) .............................................. PP 6462

(51) Int. Cl.[7] .............................................. H01L 21/76
(52) U.S. Cl. ........................ 438/434; 438/535; 438/621; 438/622; 438/547; 438/550; 438/919; 438/661; 438/662; 438/663

(58) Field of Search ................................. 438/434, 535, 438/621, 622, 547, 550, 661, 662, 663, 919, FOR 305, FOR 453

(56) References Cited

U.S. PATENT DOCUMENTS 4,312,114 A    1/1982   Schoolar

FOREIGN PATENT DOCUMENTS

EP    0422511    4/1991
EP    0911880    4/1999

*Primary Examiner*—George Fourson
*Assistant Examiner*—Khiem Nguyen
(74) *Attorney, Agent, or Firm*—Jordan and Hamburg LLP

(57) ABSTRACT

A thin film photovoltaic devices is described, having a glass substrate 11 over which is formed a thin film silicon device having an $n^{++}$ layer 12, a p layer 13 and a dielectric layer 14 (typically silicon oxide or silicon nitride). To create a connection through the p layer 13 to the underlying $n^{++}$ layer 12, a column of semi-conductor material is heated, the column passing through the various doped layers and the material in the column being heated or melted to allow migration of dopant between layer of the device in the region of the column.

29 Claims, 7 Drawing Sheets

MELT THROUGH CONTACT FORMATION METHOD

INTRODUCTION

The present invention relates generally to the formation of contacts in semi-conductor devices and in particular the invention provides a method of forming contacts to underlying regions in thin film devices.

BACKGROUND OF THE INVENTION

Typically in traditional bulk material, photovoltaic devices contacts are made to either side of the device which is typically a single junction device.

When thin film devices are made they are formed on a substrate or superstrate which is typically an electrically non-conducting material such as glass making it necessary to connect to all layers of the device through one surface of the device. If the device is illuminated through the substrate this arrangement has the advantage of substantially removing the problem of contact shading, however forming contacts to thin underlying regions presents significant challenges which tend to require expensive solutions. The aim of using thin films in photovoltaic device fabrication is to achieve low cost devices, but this aim cannot be met if the fabrication process requires expensive high accuracy alignment steps to allow contact to underlying regions without producing junction shorts.

SUMMARY OF THE INVENTION

The present invention provides a method for forming a connection region for making electrical connection to a first doped semi-conductor region of a thin film semi-conductor device located beneath at least a second doped semi-conductor region of opposite dopant type, the method including the steps of:

forming the first semi-conductor region with a predominant first dopant type;

forming at least the second semi-conductor region over the first semi-conductor region with a predominant second dopant type of opposite polarity to the first dopant type, where in the connection region, the number of excess dopants of the predominant dopant type per unit area of the film in the second semi-conductor region is lower than the number of excess dopants of the predominant dopant type per unit area of the film in the corresponding first semi-conductor region;

heating a column of semi-conductor material passing through the second semi-conductor region and into the first semi-conductor region in an area of the connection region of the semi-conductor device where a contact to the first semi-conductor region is required, the heating step causing the material in the first and second semi-conductor regions to increase in temperature whereby dopant mobility is increased.

Preferably, the heating step causes the material in the first and second semi-conductor region to melt, whereby dopant atoms of the first dopant type migrate from the first semi-conductor region to the second semi-conductor region, the dopant concentration of the first semi-conductor region before melting, being sufficiently higher than the dopant concentration of the second semi-conductor region that after redistribution of the dopant atoms in the column during the melting step, the predominant dopant type in all semi-conductor regions of the columns is the same as that of the first semi-conductor region.

In the preferred embodiment, the melting step is performed using a laser and may be performed either without significant ablation or with minimum ablation of the surface or alternately, an ablating step may be performed concurrently to open the column. The laser may be controlled to provide a variable output with time, either in a single pulse or a sequence of pulses to control the rate of melting and ablation.

The doping concentration of the heavily doped first dopant type region must be high enough to enable the dopant type in the other regions to be dominated by the dopant in the heavily doped region after migration has occurred. This requires, in the connection area, the total dopants in the first dopant type region to be greater than the total dopants in the other regions. Typically, the ratio of total dopants is greater than 2:1. In typical embodiments, the first dopant type will be present in the first semi-conductor region in the range of $2 \times 10^{14}$ to $1 \times 10^{16}$ atoms/cm$^2$ and the second dopant type will be present in the second semi-conductor region in the range of $1 \times 10^{14}$ to $5 \times 10^{15}$ atoms/cm$^2$.

In typical embodiments, the combined thickness of the semi-conductor layers is in the range 0.1 to 10 $\mu$m and preferably in the range 0.5 to 5 $\mu$m.

In one embodiment of the invention, after formation of the column of first dopant type material, a further laser step is used to form an opening into the column, leaving an outside wall of the column intact to isolate the second semi-conductor region from the opening, and metal is then formed in the opening to provide contact to the underlying first semi-conductor region via the remaining wall of the column. In the alternative embodiment where the opening is formed as part of the melting step, the metal is formed after the combined melting/ablating step.

In a second embodiment of the invention, metal is formed over the column to make contact with the column and with the underlying first semi-conductor region via the column.

In a further use of the invention, metallisation is not performed and the doped columns are used to isolate buried layer contact areas from other areas of the cell to minimise the possibility of cell performance degradation or failure due to shorting of the junction adjacent to the contact.

According to a second aspect, the present invention provides a method of forming an electrical connection to a first doped semi-conductor region of a thin film semi-conductor device located beneath at least a second doped semi-conductor region of opposite dopant type, the method including the steps of:

forming the first semi-conductor region having a first dopant type;

forming at least the second semi-conductor region over the first semi-conductor region, the second semi-conductor region having a second dopant type of opposite dopant polarity to the first dopant type;

forming a metal layer over at least an area of the semi-conductor material in a contact region where a contact is required to the first semi-conductor region;

heating the metal layer in the contact region whereby the metal and the underlying semi-conductor material melt at least down to the first semi-conductor region such that at least a part of the metal layer alloys with the underlying material to form a column of metal alloy between the first semi-conductor region and the top surface of the device.

In one method according to the second aspect of the invention, the heating step is performed with a laser to locally heat a small region of the metal layer. In another method according to the second aspect of the invention, the metal layer is restricted to the contact region and the heating step comprises a thermal annealing step whereby the entire top surface is heated, the localised metallisation in the contact region being caused to melt and alloy with the underlying regions during the annealing step.

Preferably, the metal layer in the contact region is only partly consumed in the alloying step whereby the remaining metal is available to carry current into or out of the cell. Alternatively if all of the metal is consumed in the alloying step, further metal may be formed in a subsequent step.

In preferred embodiments, there will be a dielectric layer (such as silicon oxide or silicon nitride) formed over the active regions in which case the metal layer is formed over the dielectric layer and the alloying step will produce an alloy of the metal with dielectric material in the dielectric layer as well as an alloy or mixed composite of the metal with the semi-conductor material in the semi-conductor material.

BRIEF DESCRIPTION OF THE DRAWINGS

Embodiments of the invention will now be described, by way of example, with reference to the accompanying drawings in which.

DETAILED DESCRIPTION OF THE PREFERRED EMBODIMENTS

Figure 1:
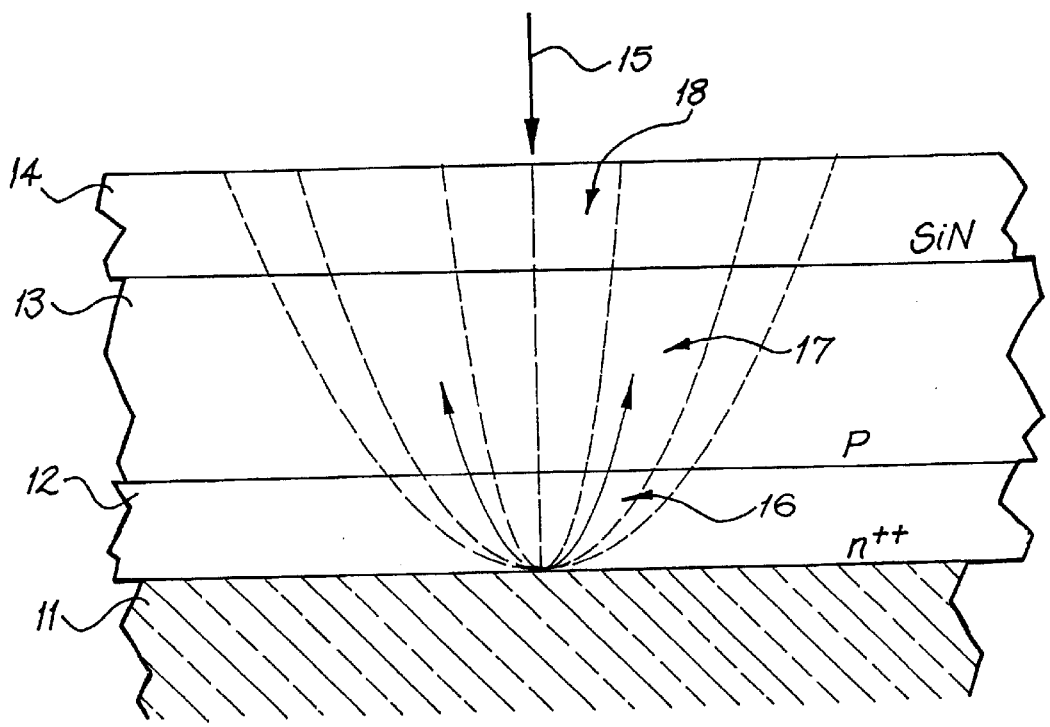
FIG. 1 is a sectional side view through a thin film device during a first melting step according to a first embodiment.

Referring to FIG. 1, a thin film photovoltaic device is illustrated in section, showing a glass substrate 11 over which is formed a thin film silicon device having an $n^{++}$ layer 12, a p layer 13 and a dielectric layer 14 (typically silicon oxide or silicon nitride).

The $n^{++}$ layer 12 is 0.1 $\mu$m thick and is formed with a very high dopant concentration, which in this example is $10^{20}$ atoms/cm$^3$, although it may be in the range of $10^{15}$–$10^{21}$ atoms/cm$^3$, while the overlying p layer is 1 $\mu$m thick and contains half the total number of p type dopants as the n type layer. For the method to work, there must be a dopant source which is able to supply enough dopant atoms to reverse the doping polarity of any oppositely doped regions between the region to be contacted to, and the surface of the structure. In the embodiment described, the dopant source is the $n^{++}$ layer to be contacted. However, in a multilayer device the dopant source may be in a layer other than the bottom layer. Also, the difference in doping level required between the source layer and the layers to which the dopant atoms must migrate, will depend on the relative volumes of the differently doped regions in the column being melted. Therefore, the thicker the source layer, the lower the required dopant concentration in the source layer.

To create a connection through the p layer 13 to the underlying $n^{++}$ layer 12, a column of semi-conductor material is heated, the column passing through the various doped layers and the material in the column being heated or melted to allow migration of dopant between layers of the device in the region of the column, preferably the heating is performed by a laser beam 15 directed at the surface of the device, with its power and pulse duration and the xy table motion adjusted to allow the desired level of heating or melting without ablation in the column formed by the areas 16 and 17 in the respective p and $n^{++}$ layers. The overlying dielectric layer 14 may be ablated in this process.

Whilst the regions 16 and 17 in the column are at an elevated temperature, n type dopant atoms will migrate from the $n^{++}$ region 12 to the p region 13 and p type dopant atoms will migrate from the p region 13 to the $n^{++}$ region 12. However, due to the very high concentration of n type dopant atoms in the $n^{++}$ region 12 relative to the p type dopant concentration in the p region 13, the n type dopant concentration in the previously p type region 17 after the migration, will become sufficiently high to change this region to an n type region, thereby forming an n-type column from the $n^{++}$ region 12 to the surface of the silicon material (while p type dopant atoms also migrate into the $n^{++}$ region 12, as their concentration is much lower, their effect can be ignored).

Figure 2:
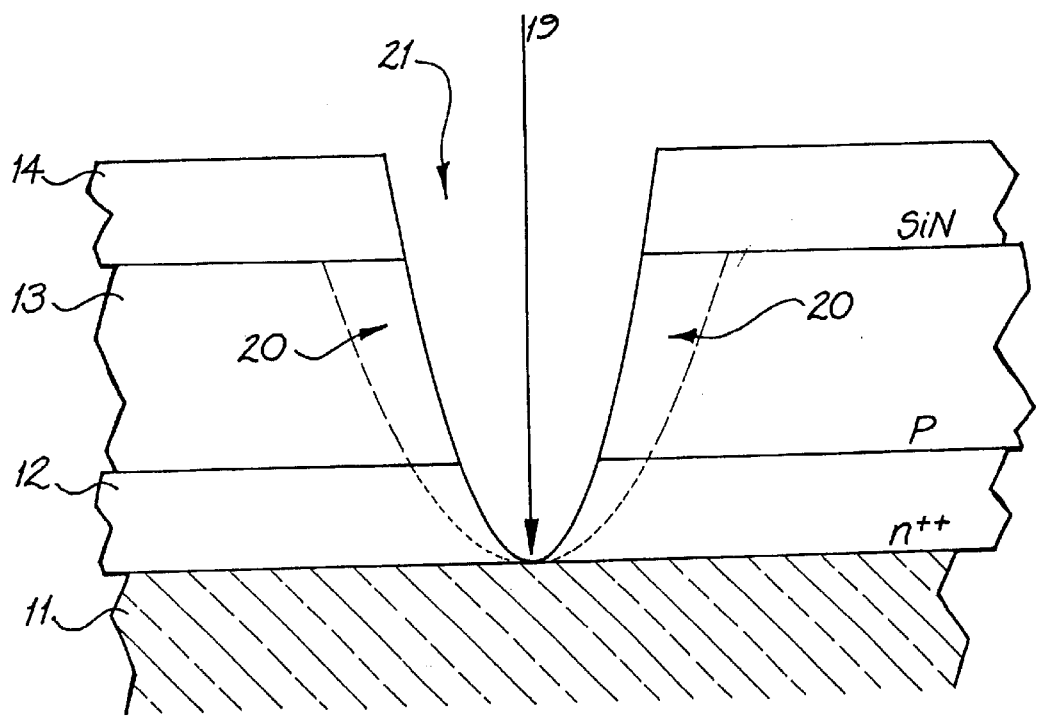
FIG. 2 is a sectional side view through the thin film device of FIG. 1 during a scribing step subsequent to the melting step.

Referring to FIG. 2, in a subsequent lasering step a laser beam 19 is directed onto the centre of the column of now n type material 17, 16 to scribe an opening 21 through the column, while leaving the side walls 20 of the column intact whereby the remaining n type side wall regions 20 isolate the opening 21 from the p type layer 13.

Alternatively, the step of scribing the opening 21 can be performed concurrently with the melting step by suitable control of the laser, such that the outer wall regions 20 of the column are melted while the centre region is ablated.

In one embodiment, the laser may be controlled during the melting and ablation step or steps to produce a pulse having an intensity over time which is tailored to melt and ablate the material under controlled conditions. Alternatively, the laser may produce a series of pulses of controlled intensity to perform the melting and ablating step or steps.

Figure 3:
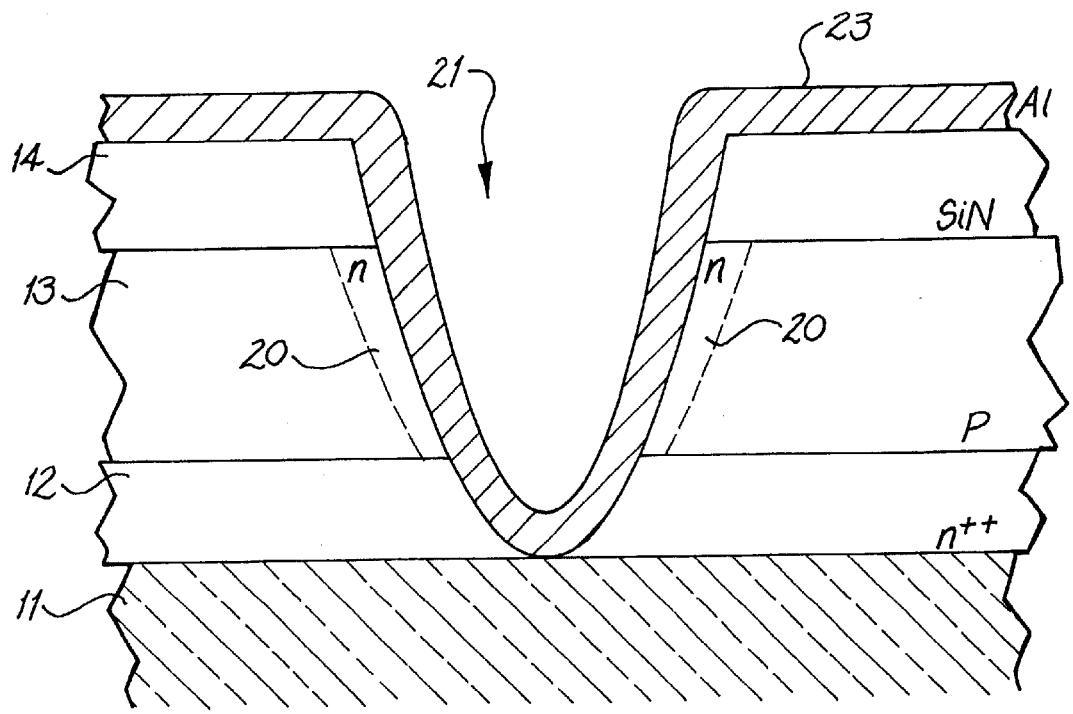
FIG. 3 is a sectional view of a variation of the device of FIGS. 1 and 2 after a metallisation step.

Following the opening step, a metallisation step is performed, to give the result shown in FIG. 3, in which the metal layer 23 extends into the opening 21 and contacts with the n type regions 12, 20 while remaining isolated from the p layer 13. Metallisation can be performed by any known method such as plating, screen printing, evaporation, sputtering, etc.

Figure 4:
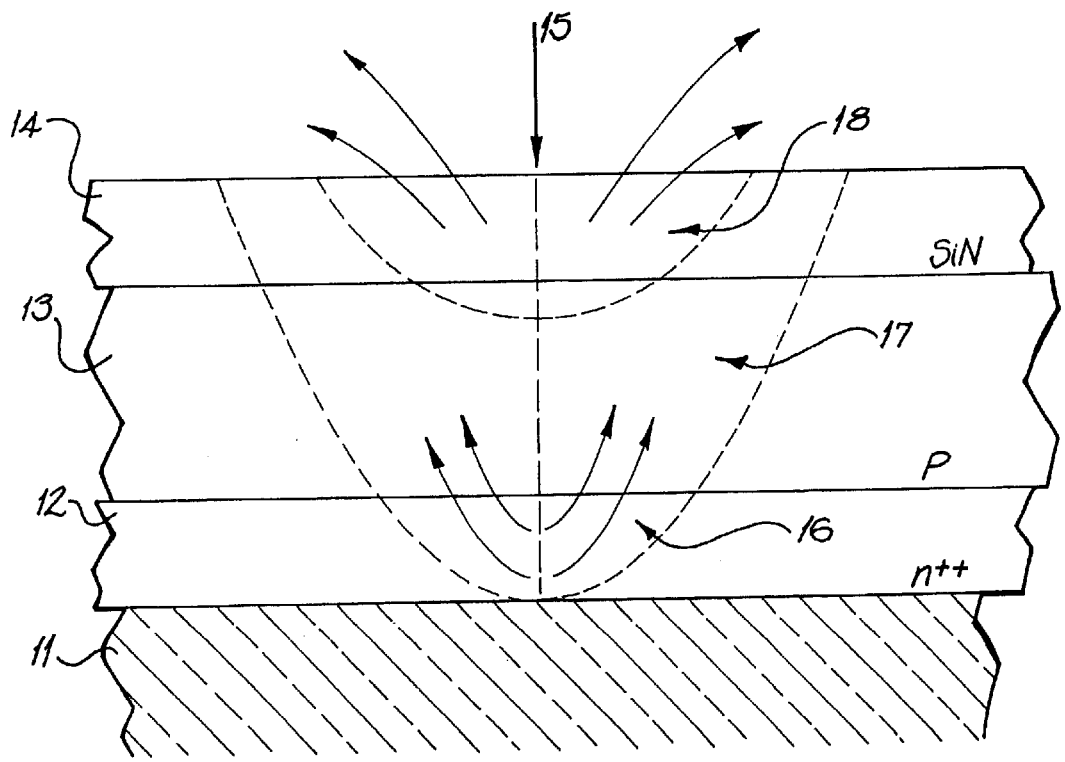
FIG. 4 is a sectional side view through a thin film device during a first melting step according to a second embodiment.

Referring to FIG. 4, a first step of a second embodiment of the invention is illustrated, in which as with FIG. 1, a thin film silicon device is formed over a glass substrate or superstrate 11. The silicon device again includes an $n^{++}$ region 12, a p region 13 and a dielectric layer 14 with similar characteristics to those of the first embodiment. Also as with the first embodiment, the first step is a laser heating step in which the laser beam 15 is used to heat the column formed by regions 16, 17 of the $n^{++}$ and p layers respectively. The difference in this case is that the laser and xy motion controls are adjusted to provide removal of the dielectric layer 14 in the region 18 above the molten silicon column 16, 17 such that the arrangement shown in FIG. 5 results after cooling with an opening 32 formed in the dielectric layer 14 and an n type column 30, 31 formed between the $n^{++}$ layer 12 and the surface of the semi-conductor material. Alternatively, the n-type column could be formed as in the embodiment of FIGS. 1–3 and the dielectric layer removed in a second laser step.

Figure 5:
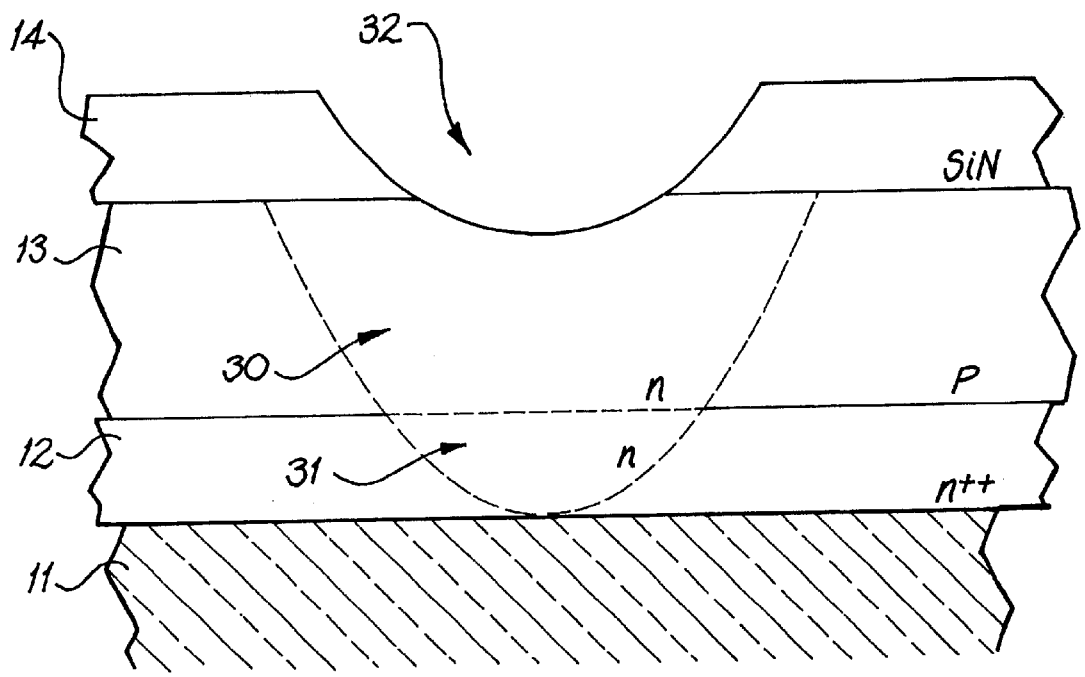
FIG. 5 is a section side view of the device of FIG. 4 after the melting step.
Figure 6:
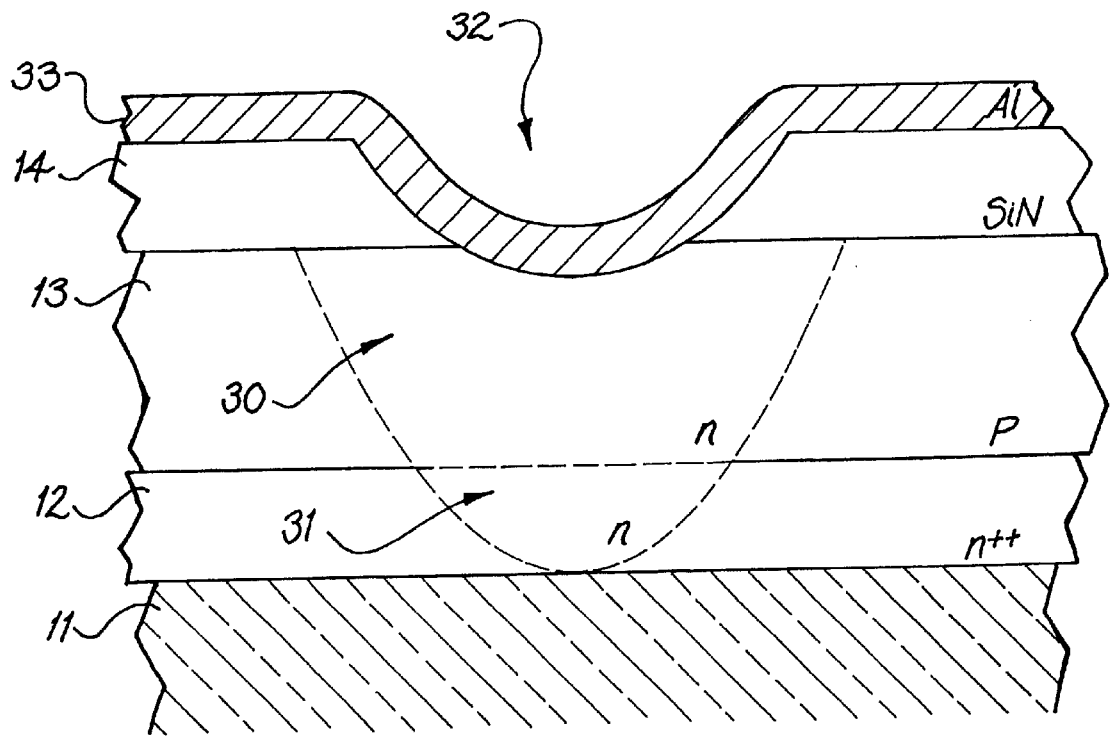
FIG. 6 is a sectional side view of a variation of the device of FIGS. 4 and 5 after a metallisation step.

As shown in FIG. 6, a metallisation step is performed over the structure of FIG. 5 to add a contact metal 33 which extends into the opening 32 and contacts the n type region 30 of the n type column which provides a connection through the p region 13 to the $n^{++}$ region 12.

Figure 7:
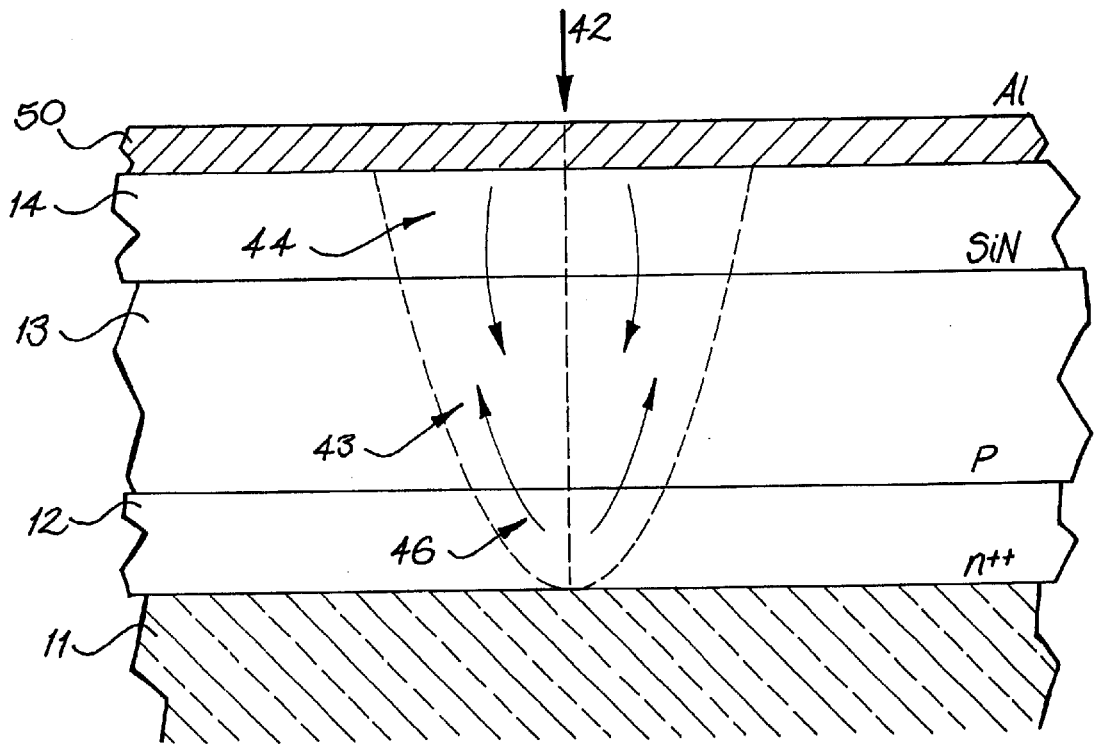
FIG. 7 is a sectional side view through a thin film device during a melting step according to a third embodiment.

Turning now to the third embodiment of the invention, FIG. 7 shows a thin film device similar to those of FIGS. 1 and 4, in which an $n^{++}$ layer 12 is formed over a glass substrate or superstrate 11 with a p type layer 13 formed over the $n^{++}$ layer 12, and a dielectric layer 14 formed over the p type layer 13. In this embodiment, however, the metallisation is performed before column formation with a metal contact 50 applied at least in the area where a contact is to be provided to the $n^{++}$ layer 12 and in the arrangement illustrated in FIG. 7 is applied over the whole surface.

As shown in FIG. 7, a laser beam 42 is used to heat the contact metal, which is typically aluminium, and the underlying column of silicon 46, 43 and the dielectric layer in the region 44. While the silicon is molten, dopant atoms will again migrate from the $n^{++}$ region 46 to the p type layer 43 forming an n type column 48 (see FIG. 8). However, molten metal will also begin to alloy or react with the underlying layers 44., 43, 46 progressively, forming a wedge of metal/dielectric and metal/silicon alloy or composite 47 reaching down to the $n^{++}$ layer 12 as shown in FIG. 8.

Figure 8:
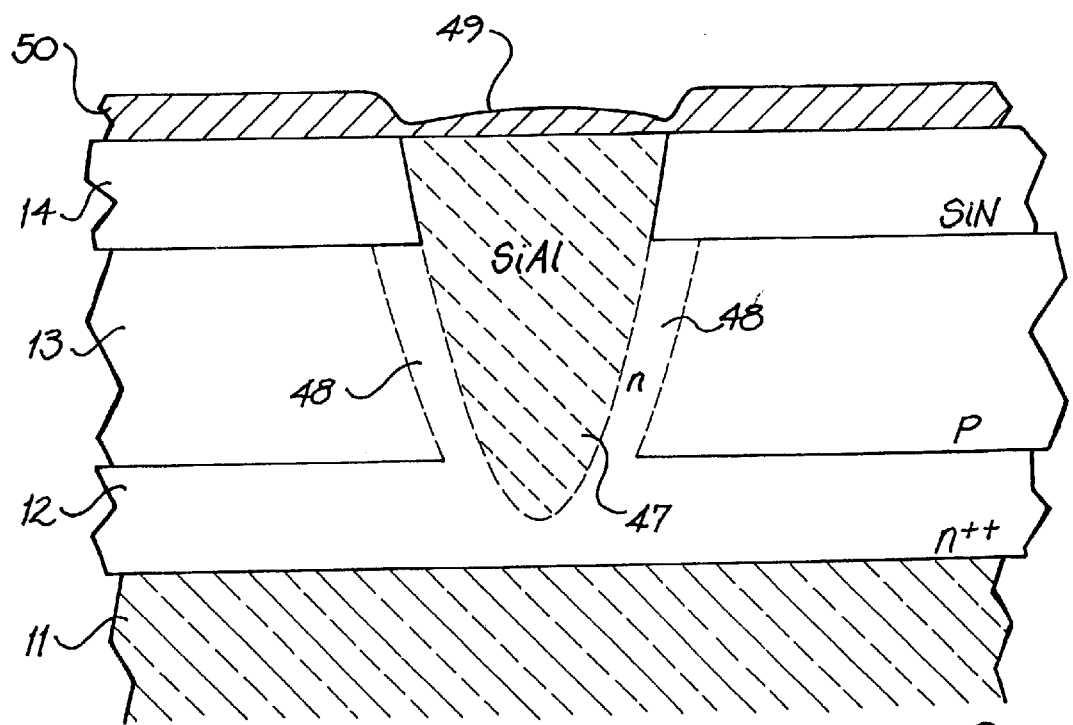
FIG. 8 is a sectional side view of the device of FIG. 7 after the melting step is completed.

The resultant structure shown in FIG. 8, has a contact 49 formed by the metal layer remaining on the surface, an aluminium/silicon/dielectric column 47 isolated from the p type layer 13 by an n type column 48 and reaching down to contact, either directly or via the region 48 with the $n^{++}$ region 12.

Figure 9:
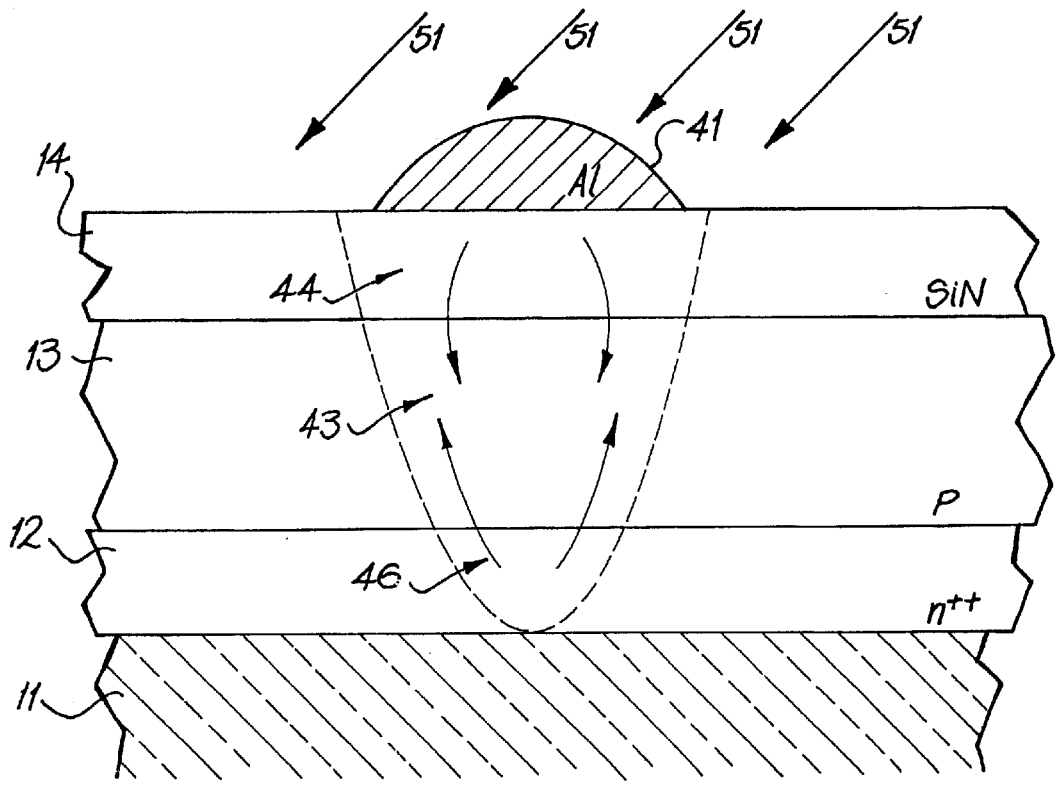
FIG. 9 is a sectional side view through a thin film device during a melting step according to a further embodiment.
Figure 10:
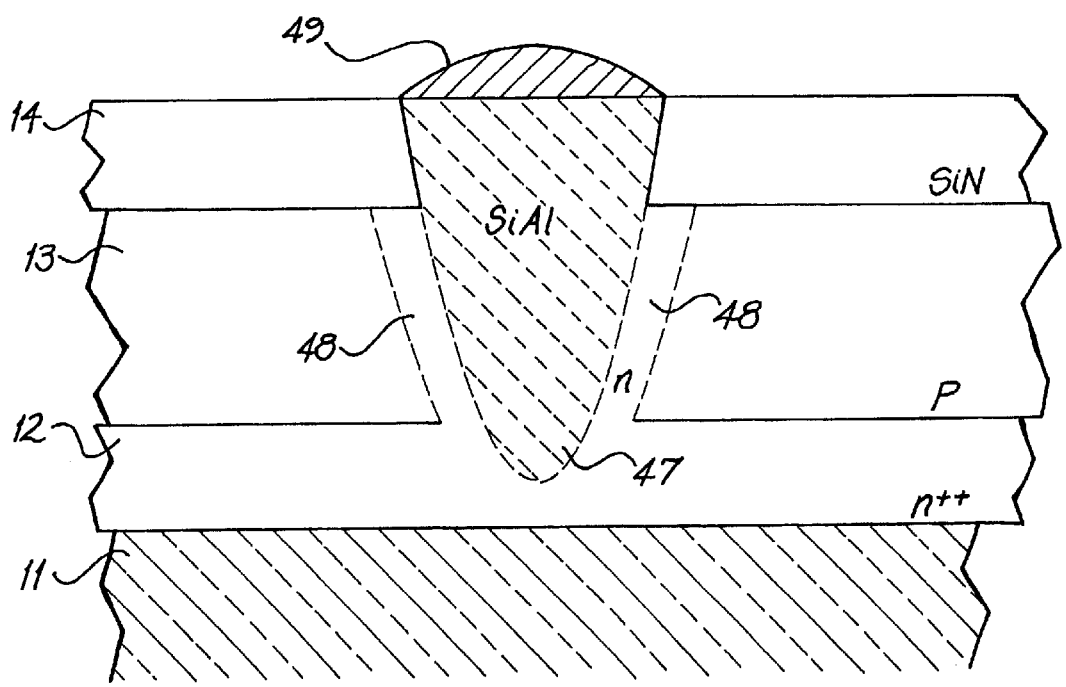
FIG. 10 is a sectional side view of the device of FIG. 9 after the melting step is completed.

In an alternative arrangement to that of FIG. 7 as illustrated in FIG. 9, metallisation 41 is restricted to the contact regions in which case, the contact formation can be incorporated in a rapid thermal annealing step in which a distributed source of heat 51 is applied to the surface of the device to simultaneously anneal the semi-conductor material and form the contact column comprising the alloy region 47 and the n type walls 48 as shown in FIG. 10.

In an alternative arrangement to that of FIG. 7 as illustrated in FIG. 9, the metallisation 42 is restricted to the contact regions in which case, the contact formation can be incorporated in a rapid thermal annealing step in which a distributed source of heat 51 is applied to the surface of the device to simultaneously anneal the semi-conductor material and form the contact column comprising the alloy region 47 and the n type walls 48 as shown in FIG. 10.

Figure 11:
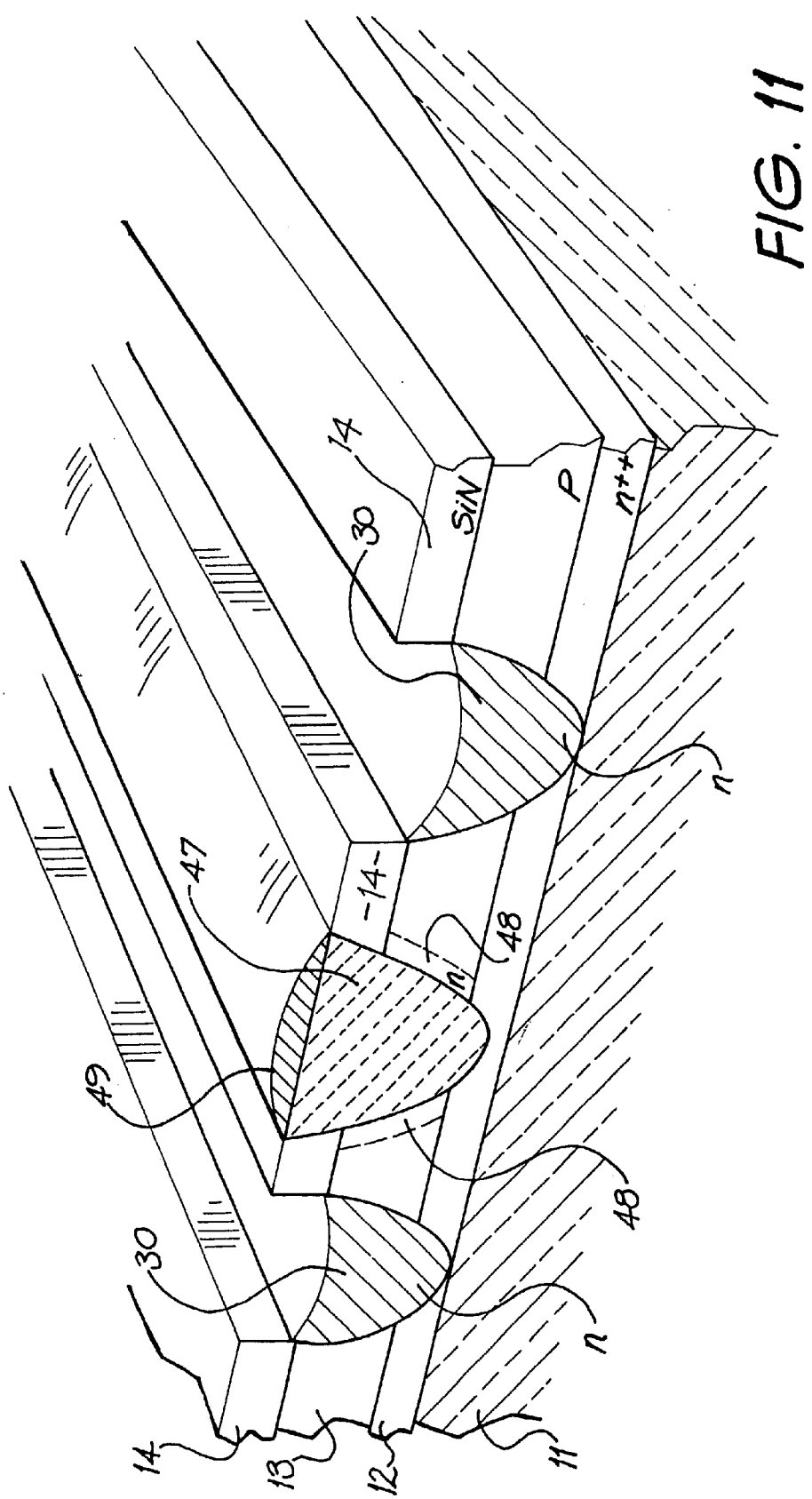
FIG. 11 illustrates the use of an embodiment of the invention to form a contact surrounded by isolation grooves also formed by a method according to the invention.

Referring to FIG. 11, a contact having the structure of FIG. 10 is illustrated, surrounded by two n types doped regions 30 similar to the n type doped column of FIG. 5, but with the contacts spaced so as to overlap in a contiguous manner. The two doped columns 30 isolate the majority of the p type layer 13 from the contact area and protect against the possibility of a short forming through the doped column 48 surrounding the alloy plug 47.

Figure 12:
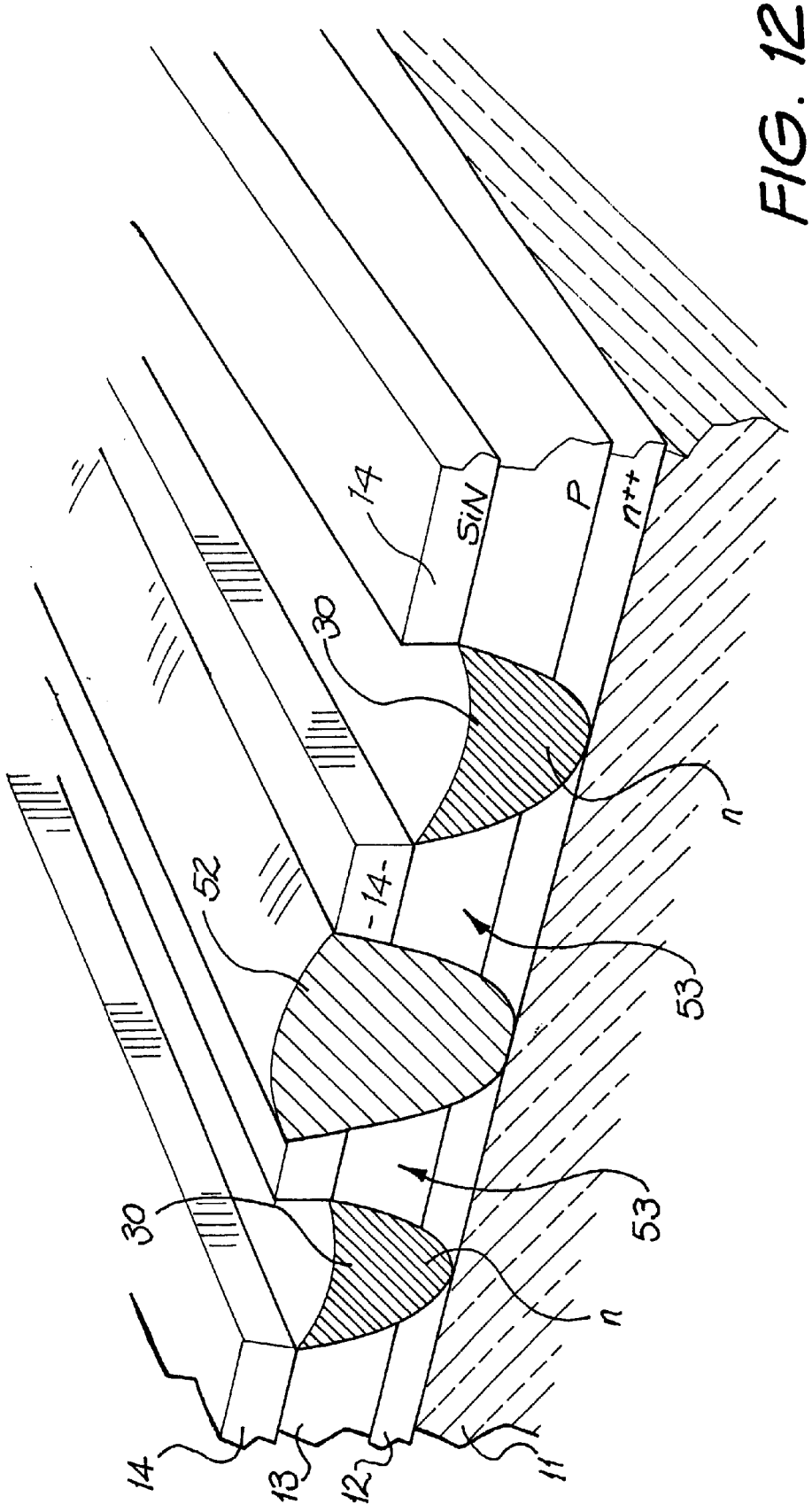
FIG. 12 illustrates the use of a simple metal filled groove contacting to an underlying layer surrounded by isolation grooves formed by a method according to the invention.

A further arrangement is illustrated in FIG. 12 in which two doped regions 30 isolate a region 53 surrounding the bottom layer contact 52 from the remainder of the p type region 13 and the metal contact 52 is formed through an opening in the dielectric layer 14 and the p type region 13 such that contact is made directly with the $n^{++}$ region 12. Because the metal contact will shunt to the surrounding p type region 53, the doped regions 30 are provided to isolate this region from the remainder of the p type region 13.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

What is claimed is:

1. A method for forming a connection region for making electrical connection to a first doped semi-conductor region of a thin film semi-conductor device located beneath at least a second doped semi-conductor region of opposite dopant type, the method including the steps of:

forming the first semi-conductor region with a predominant first dopant type of first dopant polarity, such that there is an excess number of dopant atoms of the first dopant type with respect to dopant atoms of a second dopant type of opposite dopant polarity in the first semi-conductor region;

forming at least the second semi-conductor region over the first semi-conductor region with a predominant dopant type of the second dopant polarity, such that there is an excess number of dopant atoms of the second dopant polarity with respect to dopant atoms of the first dopant polarity in the second semiconductor region and where, in the connection region, the excess number of dopant atoms of the predominant second dopant polarity per unit area of the film in the second semi-conductor region is lower than the number of excess dopant atoms of the predominant first dopant type per unit area of the film in the corresponding first semi-conductor region;

heating a column of semi-conductor material passing through the second semi-conductor region and into the first semi-conductor region in an area of the connection region of the semi-conductor device where a contact to the first semi-conductor region is required, the heating step causing the material in the first and second semi-conductor regions to increase in temperature whereby dopant mobility is increased and dopant atoms of the first dopant polarity migrate from the first semi-conductor region to the second semi-conductor region to locally change the dopant polarity of the predominant dopant type in the second semi-conductor region.

2. The method of claim 1, wherein the heating step causes the material in the first and second semi-conductor region to melt whereby dopant atoms of the first dopant type migrate from the first semi-conductor region to the second semi-conductor region.

3. The method of claim 2, wherein the heating step is performed without significant ablation of a surface of the semi-conductor device.

4. The method of claim 2, wherein the excess number of dopant atoms of the first dopant type with respect to dopant atoms of a second dopant type in the first semi-conductor region before melting, is sufficiently higher than the excess number of dopant atoms of the second dopant type with respect to dopant atoms of the first dopant type in the second semi-conductor region that after redistribution of the dopant atoms in the column during the melting step, the predominant dopant polarity in all semi-conductor regions of the column is the same as that of the first semi-conductor region.

5. The method of claim 2, wherein the melting step is performed using a laser.

6. The method of claim 2, wherein the dopant concentration in the first dopant type region is greater than the dopant concentration in the other regions by a ratio that is greater than the inverse of the ratio of the volumes of the region of the first semi-conductor film in the column and the total volume of the column affected by the heating step.

7. The method of claim 2, wherein, in a two layer device, a ratio of total dopants in the first semi-conductor layer exceeds that in the second semi-conductor layer by a ratio of at least 2:1.

8. The method of claim 7, wherein the ratio of dopant concentrations is greater than 100:1.

9. The method of claim 7 wherein the total dopants of the first dopant type is in the range of $2 \times 10^{14}$ to $1 \times 10^{16}$ atoms/cm$^2$ and the total dopants of the second dopant type is in the range of $1 \times 10^{14}$ to $5 \times 10^{15}$ atoms/cm$^2$.

10. The method of claim 2, wherein a combined thickness of the semi-conductor layers is in the range of 0.5 to 5 $\mu$m.

11. The method of claim 2, wherein after formation of the column of first dopant type material, a further laser step is performed to form an opening into the column, leaving an outside wall of the column intact to isolate the second semi-conductor region from the opening.

12. The method of claim 11, wherein the heating step and the opening step are performed by different laser pulses.

13. The method of claim 11, wherein metal is formed in the opening to provide contact to the underlying first semi-conductor region via the remaining wall of the column.

14. The method of claim 2, wherein after formation of the column of first dopant type material, metal is formed over the column to make contact with the column and with the underlying first semi-conductor region via the column.

15. The method of claim 2, wherein the columns of first dopant type material are used to isolate buried layer contact areas from other areas of the cell to minimise the possibility of cell performance degradation or failure due to shorting of the junction adjacent to the contact.

16. The method of claim 2, wherein the step of heating a column of semi-conductor material is performed such that the material in the column melts and at least part of the material is ablated to form an opening in the column with the walls of the opening doped predominantly with the first dopant type to isolate the opening from the second semi-conductor region.

17. The method of claim 16, wherein the heating and opening steps are performed with a single laser pulse.

18. The method of claim 17, wherein the single pulse is shaped to control the rate of melting and ablation.

19. The method of claim 16, wherein the heating and ablating step is performed by a sequence of laser pulses.

20. The method of claim 19, wherein the sequence of laser pulses are varied in intensity to control the rate of melting and ablation.

21. A method of forming an electrical connection to a first doped semi-conductor region of a thin film semi-conductor device located beneath at least a second doped semi-conductor region of opposite dopant type, the method including the steps of:

forming the first semi-conductor region having a predominant first dopant type of first dopant polarity, such that there is an excess number of dopant atoms of the first dopant type with respect to dopant atoms of a second dopant type of opposite dopant polarity in the first semi-conductor region;

forming at least the second semi-conductor region over the first semi-conductor region, the second semi-conductor region having a predominant second dopant type of opposite dopant polarity to the first dopant type, such that there is an excess number of dopant atoms of the second dopant polarity with respect to dopant atoms of the first dopant polarity in the second semi-conductor region;

forming a metal layer over at least an area of the semi-conductor material in a contact region where a contact is required to the first semi-conductor region;

heating the metal layer in the contact region whereby the metal and the underlying semi-conductor material melt at least down to the first semi-conductor region such that at least a part of the metal layer alloys with the underlying material to form a column of metal alloy between the first semi-conductor region and the top surface of the device and dopant mobility is increased whereby excess dopant molecules of the first dopant polarity occupy a shell around the alloy in the second semi-conductor region to locally change the dopant polarity of the predominant dopant type in the second semi-conductor region in the shell.

22. The method of claim 21, wherein the heating step is performed with a laser to locally heat a small region of the metal layer.

23. The method of claim 21, wherein the metal layer is restricted to the contact region and the heating step comprises a thermal annealing step whereby the entire top surface is heated, the localised metallisation in the contact region being caused to melt and alloy with the underlying regions during the annealing step.

24. The method of claim 21, wherein the metal layer in the contact region is only partly consumed in the alloying step whereby the remaining metal forms part of a metallisation of the contact.

25. The method of claim 21, wherein all of the metal layer in the contact region is consumed in the alloying step, and further metal is formed in a subsequent step.

26. The method of claim 21, wherein a dielectric layer is formed over the active regions and the metal layer is formed over the dielectric layer such that the alloying step produces an alloy of the metal with dielectric material in the dielectric layer as well as an alloy or mixed composite of the metal with the semi-conductor material in the semi-conductor material layer.

27. The method of claim 26, wherein the dielectric layer formed over the active regions is formed of a material selected from silicon oxide or silicon nitride.

28. The method of claim 22, wherein all of the metal layer in the contact region is consumed in the alloying step, and further metal is formed in a subsequent step.

29. The method of claim 23, wherein all of the metal layer in the contact region is consumed in the alloying step, and further metal is formed in a subsequent step.

* * * * *